US010003414B2

(12) United States Patent
Casagrande

(10) Patent No.: US 10,003,414 B2
(45) Date of Patent: Jun. 19, 2018

(54) METHOD FOR CALIBRATING A FREQUENCY SYNTHESISER USING TWO-POINT FSK MODULATION

(71) Applicant: The Swatch Group Research and Development Ltd, Marin (CH)

(72) Inventor: Arnaud Casagrande, Bole (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days. days.

(21) Appl. No.: 15/345,811

(22) Filed: Nov. 8, 2016

(65) Prior Publication Data
US 2017/0141857 A1    May 18, 2017

(30) Foreign Application Priority Data
Nov. 13, 2015 (EP) .................................. 15194566

(51) Int. Cl.
*H04B 1/38* (2015.01)
*H04B 17/11* (2015.01)
(Continued)

(52) U.S. Cl.
CPC ............. *H04B 17/11* (2015.01); *H03C 3/095* (2013.01); *H03C 3/0941* (2013.01); *H03C 3/0975* (2013.01); *H03C 3/0991* (2013.01); *H03F 3/195* (2013.01); *H03F 3/245* (2013.01); *H03G 3/3047* (2013.01);
(Continued)

(58) Field of Classification Search
CPC .... H03C 3/0941; H03C 3/095; H03C 3/0991; H03C 3/0925; H03C 3/0933; H03C 3/0975
See application file for complete search history.

(56) References Cited

U.S. PATENT DOCUMENTS

| 5,079,522 A | 1/1992 | Owen et al. |
| 6,515,553 B1 | 2/2003 | Filiol et al. |

(Continued)

FOREIGN PATENT DOCUMENTS

| EP | 0 423 941 A2 | 4/1991 |
| EP | 0 961 412 A1 | 12/1999 |
| EP | 2 173 029 B1 | 12/2010 |

OTHER PUBLICATIONS

European Search Report dated May 25, 2016 in European Application 15194566.4 filed on Nov. 13, 2015 (with English Translation of Categories of Cited Documents).

*Primary Examiner* — Khanh C Tran
(74) *Attorney, Agent, or Firm* — Oblon, McClelland, Maier & Neustadt, L.L.P.

(57) ABSTRACT

The method for calibrating the frequency synthesizer using two-point FSK modulation consists, in a first phase, in supplying an excitation signal generated by a calibration unit to a sigma-delta modulator by deactivating a digital-to-analog converter and transmitting the output signal from a loop filter of the synthesizer to the calibration unit, which digitally converts the incoming signal and offsets the phase shift between the excitation signal and the loop filter output signal in the calibration unit. In a second phase, the excitation signal is supplied to the sigma-delta modulator and to the activated digital-to-analog converter, and the digital-to-analog converter gain is calibrated by checking, in the calibration unit, the polarity of the loop filter output signal with respect to the excitation signal, and using a dichotomy algorithm.

10 Claims, 2 Drawing Sheets

(51) Int. Cl.
  *H04B 17/21* (2015.01)
  *H03F 3/195* (2006.01)
  *H03F 3/24* (2006.01)
  *H03G 3/30* (2006.01)
  *H03L 7/089* (2006.01)
  *H03L 7/091* (2006.01)
  *H03L 7/099* (2006.01)
  *H03L 7/185* (2006.01)
  *H03C 3/09* (2006.01)

(52) U.S. Cl.
  CPC ............ *H03L 7/0891* (2013.01); *H03L 7/091* (2013.01); *H03L 7/099* (2013.01); *H03L 7/185* (2013.01); *H04B 17/21* (2015.01); *H03F 2200/294* (2013.01); *H03F 2200/451* (2013.01)

(56) References Cited

U.S. PATENT DOCUMENTS

| | | | |
|---|---|---|---|
| 9,331,704 B2* | 5/2016 | Tang | H03L 7/16 |
| 2004/0036539 A1* | 2/2004 | Hammes | H03C 3/0925 331/16 |
| 2005/0046488 A1* | 3/2005 | Grewing | H03C 3/0925 331/23 |
| 2005/0084034 A1* | 4/2005 | Hammes | H03C 3/0925 375/295 |
| 2006/0055467 A1 | 3/2006 | Ochi et al. | |
| 2008/0007346 A1 | 1/2008 | Jensen et al. | |
| 2009/0002079 A1* | 1/2009 | Venuti | H03C 3/0925 331/10 |
| 2009/0153254 A1* | 6/2009 | Yu | H03C 3/0925 331/16 |
| 2009/0219100 A1* | 9/2009 | Pullela | H03C 3/0925 331/44 |
| 2009/0278613 A1 | 11/2009 | Jensen et al. | |
| 2009/0295493 A1 | 12/2009 | Lee et al. | |
| 2010/0066459 A1 | 3/2010 | Ahn | |
| 2012/0019328 A1* | 1/2012 | Shibata | H03L 7/0891 331/34 |
| 2014/0106681 A1* | 4/2014 | Leung | H04B 1/62 455/73 |

* cited by examiner

METHOD FOR CALIBRATING A FREQUENCY SYNTHESISER USING TWO-POINT FSK MODULATION

This application claims priority from European Patent Application No. 15194566.4 filed on Nov. 13, 2015, the entire disclosure of which is hereby incorporated herein by reference.

FIELD OF THE INVENTION

The invention concerns a method for calibrating a frequency synthesiser using two-point modulation, particularly in an FSK RF signal transceiver.

The invention also concerns an RF signal transceiver with a frequency synthesiser using two-point modulation for implementing the calibration method.

BACKGROUND OF THE INVENTION

For the transmission or reception of data or commands, for example within a short range, a conventional transceiver uses FSK (frequency shift keying) modulation. If the RF carrier frequency is high, for example on the order of 2.4 GHz, a relatively high bandwidth is selected for the intermediate frequency, in particular, higher than or equal to 200 kHz. The modulation frequency deviation in the modulated signals can be adjusted according to the bandwidth. In such case, a reference frequency can be used, provided by a local oscillator, which may be not very precise and therefore inexpensive. However, account must be taken of thermal noise power, which is proportional to the selected bandwidth. Thus a wide-band transmission or reception system generally does not have excellent sensitivity.

The patent application EP 0 961 412 A1 discloses a frequency synthesizer for two-point frequency modulation for the transmission of data. This frequency synthesiser uses a sigma-delta modulator to modulate data by controlling a variable divider in the low frequency phase-locked loop (PLL), and a digital-to-analogue converter (DAC) for high frequency modulation. This DAC has a variable gain, which is adjusted by a digital control unit, and is controlled by a digital control signal for the data frequency modulation. This digital control signal is also transmitted to the sigma-delta modulator to combine the modulation of the low-frequency PLL and that provided by the DAC.

In the synthesiser, the relative delay of the modulation signal passing through the DAC is varied with respect to the modulation in the low-frequency PLL. However, there is nothing disclosed in this document regarding, for example, adjusting the amplitude level of the spectrum of data modulated by the low-frequency PLL and via the DAC converter. Undesired interference may therefore occur depending on the state transition frequency for the data transmission. Moreover, it is relatively complicated to adjust the DAC gain, which constitutes a drawback.

The patent EP 2 173 029 B1 discloses a self-calibration method for a frequency synthesiser using two-point FSK modulation for the transmission of data. The frequency synthesiser includes a first low-frequency phase locked loop (PLL) in which is placed a voltage-controlled oscillator, and a high frequency access, which includes a digital-to-analogue converter, connected to the voltage-controlled oscillator. The first PLL also includes a reference oscillator, a phase comparator connected to the reference oscillator, a first low-pass loop filter, and a multi-mode divider counter controlled by a modulator for supplying the phase comparator with a divided signal on the basis of a high frequency output signal from the synthesiser. The voltage-controlled oscillator is controlled at a first input by a first control voltage signal from the first loop filter, and at a second input by a second control voltage signal for modulating the high frequency data.

For the self-calibration method for the frequency synthesiser of the patent EP 2 173 029 B1, there is described a dichotomy algorithm for adjusting the gain of a DAC. A continuous voltage comparison is performed in another comparator to control a logic circuit for adjusting the DAC gain. All the operations for calibrating the DAC gain are performed in open loop mode in the first low-frequency PLL. Voltage drifts occur during closed loop operation. Consequently, this creates voltage differences and a phase shift in the signals to be filtered before the voltage-controlled oscillator during operation in closed loop mode after calibration. Moreover, it takes a long time to calibrate the synthesiser, which constitutes drawbacks.

There is also known a frequency synthesiser using two-point modulation, wherein the operations to calibrate the two-point modulator are performed by minimising the output power of the loop filter or of the DAC. In calibration mode, the output voltage of the loop filter can also be minimised by a least-mean square (LMS) algorithm controlling the DAC gain. This requires a complicated circuit structure, which constitutes a drawback.

SUMMARY OF THE INVENTION

It is therefore an object of the invention to provide a method for calibrating a frequency synthesiser using two-point modulation, which is easy to implement and can be performed quickly in closed loop calibration and which overcomes the drawbacks of the aforementioned prior art.

To this end, the invention concerns a method for calibrating a frequency synthesiser using two-point modulation in a transceiver, the frequency synthesiser comprising:
- a low-frequency or low-pass phase-locked loop, which comprises at least one phase comparator for comparing a reference signal from a reference oscillator, and a modulation signal from a sigma-delta modulator, a charge pump connected to the output of the comparator, a loop filter connected to the output of the charge pump, a voltage-controlled oscillator VCO receiving an output signal from the loop filter, and generating a high frequency signal, and a programmable divider connected to the sigma-delta modulator and receiving the high frequency signal, and
- a high frequency access with a digital-to-analogue converter DAC, which is connected to the voltage-controlled oscillator VCO of the phase-locked loop directly or via an adder, which performs the addition of the output signal from the loop filter, and the output signal from the digital-to-analogue converter, wherein the calibration method includes the following steps:
- in a first phase of a calibration mode with the phase-locked loop closed, supplying an excitation signal generated by a calibration unit of the transceiver to the sigma-delta modulator by deactivating the digital-to-analogue converter and transmitting the output signal from the loop filter to the calibration unit, which digitally converts the incoming signal transmitted from the output of the loop filter, and offsetting the phase shift between the excitation signal and at least the output signal from the loop filter in the calibration unit, and in a second phase of the calibration mode with the phase-locked loop closed, supplying the excitation signal to the sigma-delta modulator and to the activated digital-to-analogue converter, and calibrating the gain of the digital-to-analogue converter, by checking in the calibration unit, the sign or the polarity of the output signal from the loop filter with respect to the excitation signal, and using a dichotomy algorithm to adjust the gain.

Particular steps of the calibration method are defined in the dependent claims 2 to 7.

One advantage of the calibration method lies in the fact that the phase-locked loop (PLL) of the synthesiser is in a closed state for performing the steps of the calibration method. This avoids the voltage drifts observed in the aforementioned prior art in open loop calibration.

Advantageously, only two calibration phases are necessary. In a first phase, the phase shift is adjusted in the analogue part of the synthesiser after the excitation signal is supplied to the calibration unit. The phase shifted signal in this first phase is brought back onto either the in-phase or quadrature axes of the constellation, preferably onto the I-axis (cosine). There is therefore a projection onto the I-axis in the first phase. In a second phase, once the phase shift is logically returned to 0 in the calibration unit, the digital-to-analogue converter (DAC) gain is adjusted by means of a dichotomy algorithm. Following correction of the phase shift in the first phase, in the second phase only the polarity of the loop filter output signal can be checked. This polarity check in the calibration unit makes it possible to tell whether the DAC gain is too high or too low and to adjust it easily.

Advantageously, once the phase shift has been corrected by controlling the zero crossings of the incoming signal in the calibration unit, it is therefore no longer necessary to minimise operating power to calibrate the DAC gain. With the two calibration phases, there is active noise suppression in the PLL.

Advantageously, components that already exist in the transceiver that includes the frequency synthesiser using two-point modulation are used to calibrate said frequency synthesiser. This saves space in the integrated circuit structure and reduces the general power consumption of the circuit for these calibration operations. Bluetooth communication can be achieved using the calibrated frequency synthesiser. It is also possible to envisage calibrating said synthesiser during operation of the transceiver, particularly during data modulation.

To this end, the invention also concerns a RF signal transceiver, which includes a frequency synthesiser using two-point modulation suitable for implementing the calibration method, the transceiver comprising at least one calibration unit for adjusting the phase shift of an excitation signal transmitted to the frequency synthesiser in calibration mode and calibrating the gain of a digital-to-analogue converter by dichotomy algorithm, and wherein the frequency synthesiser includes:

a low-frequency or low-pass phase-locked loop, which comprises at least one phase comparator for comparing a reference signal from a reference oscillator, and a modulation signal from a sigma-delta modulator, a charge pump connected to the output of the comparator, a loop filter connected to the output of the charge pump, a voltage-controlled oscillator VCO receiving an output signal from the loop filter, and generating a high frequency signal, and a programmable divider connected to the sigma-delta modulator and receiving the high frequency signal, and a high frequency access with the digital-to-analogue converter DAC, which is connected to the voltage-controlled oscillator VCO of the phase-locked loop directly or via an adder, which performs the addition of the output signal from the loop filter, and the output signal from the digital-to-analogue converter.

Particular embodiments of the RF signal transceiver are defined in the dependent claims.

BRIEF DESCRIPTION OF THE DRAWINGS

The objects, advantages and features of the method for calibrating a frequency synthesiser using two-point modulation in an FSK RF signal transceiver will appear more clearly in the following description through the drawings, in which.

DETAILED DESCRIPTION OF THE INVENTION

In the following description, all those components of the frequency synthesiser using two-point modulation, particularly in an FSK RF signal transceiver for implementing the calibration method, which are well known to those skilled in the art in this technical field will be described only in a simplified manner. There is primarily described a transceiver with a frequency synthesiser using two-point FSK modulation.

Figure 1:
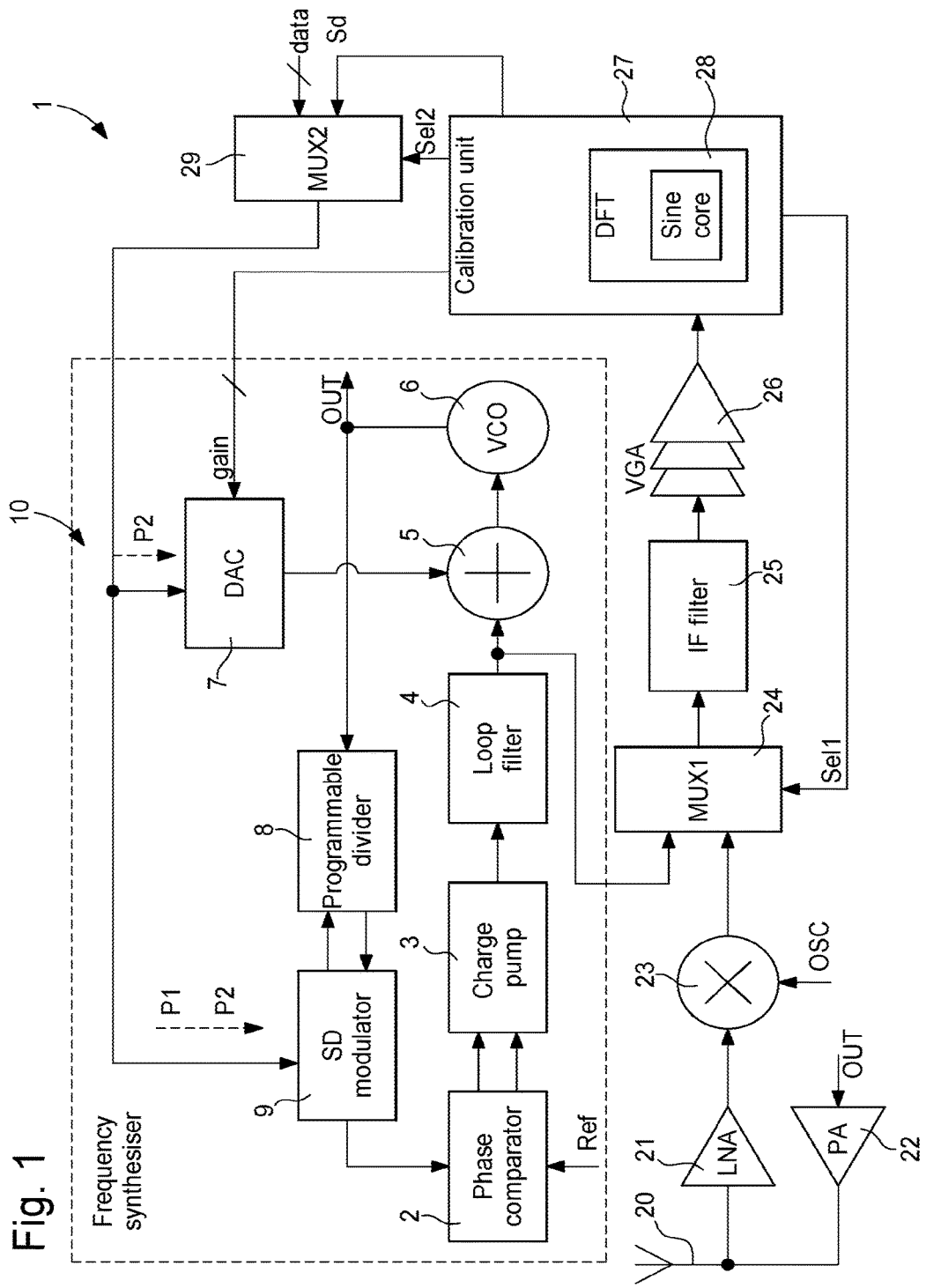
FIG. 1 shows a simplified view of a transceiver comprising the frequency synthesiser using two-point modulation to be calibrated by the calibration method according to the invention.

FIG. 1 shows a general view of an FSK RF signal transceiver 1, which includes a frequency synthesiser 10 using two-point FSK modulation. In normal operating mode, transceiver 1 includes at least one transmission/reception antenna 20 for FSK or GFSK RF signals at a carrier frequency on the order of 2.4 GHz. Transceiver 1 also includes an amplifier PA at output 22 for modulated signals OUT output by frequency synthesiser 10 to be transmitted by antenna 20, and a low noise reception amplifier (LNA) 21 receiving signals from antenna 20. The amplified and filtered signals in reception amplifier 21 are converted in frequency in at least one mixer 23 by means of an oscillating signal OSC supplied by a local oscillator (not shown). The outgoing signals from mixer 23 are simple or quadrature intermediate signals which may be baseband signals. These intermediate signals are filtered in a filter IF 25, which is a low-pass or baseband filter. A variable gain amplifier (VGA) 26 amplifies the filtered signals to supply them in a conventional manner to a processing unit (not represented) to demodulate the incoming data signals.

It is to be noted that, generally, the filtered and amplified intermediate signals are digitally converted in the processing unit, i.e. sampled and clocked by a clock signal from a reference oscillator. This reference oscillator may be a quartz resonator operating at 26 MHz, followed by a series of dividers-by-two. For example, there may be 4 dividers-by-two in series (not represented). After conversion, a projection can also be made onto either the in-phase I or quadrature Q axes of the constellation based on the samples in the processing unit. This projection corresponds to one frequency bin, i.e. a single frequency of a half discrete Fourier transform DFT. The reference oscillator (not represented) supplies a reference signal Ref for frequency synthesiser 10.

Frequency synthesiser 10 may be a synthesiser using two-point FSK or GFSK frequency modulation. Frequency synthesiser 10 mainly comprises a low-frequency or low-pass phase-locked loop, and a high frequency access connected to a voltage-controlled oscillator (VCO) 6 of the phase-locked loop. The high frequency access comprises a digital-to-analogue converter (DAC) 7.

Frequency synthesiser 10 thus includes a phase comparator 2 in the phase-locked loop. This comparator 2 receives a reference signal Ref from a reference oscillator (not represented), but which may form part of said frequency synthesiser, and a modulation signal from a sigma-delta modulator 9. High and low comparison signals output by the comparator are supplied to a charge pump 3, which supplies a signal to a loop filter, which is a low-pass filter 4. As shown in FIG. 1, the output signal from loop filter 4 is added in an adder 5 to an output signal from DAC converter 7, so as to control VCO 6 which has only one varactor in this case. However, it is possible to envisage a VCO 6 having 2 dedicated varactors in parallel, which are independent of each other, without using an adder 5.

VCO 6 is capable of generating a high frequency signal OUT. High frequency signal OUT also passes through a programmable divider 8 which is in two-directional connection with sigma-delta modulator 9 to close the phase-locked loop. In normal operation, a data signal data is supplied by a processing unit to DAC 7 and to sigma-delta modulator 9 for the two-point FSK modulation by the frequency synthesiser and to supply a high frequency FSK modulation signal OUT. The carrier frequency of signal OUT may be close to 1.2 GHz or 2.4 GHz. For a frequency of 1.2 GHz, frequency multiplication may also be performed for transmission of an FSK modulation signal by an antenna of transceiver 1 at a carrier frequency of 2.4 GHz.

Transceiver 1 also includes a calibration unit 27, which may form part of a processing unit (not represented). A first multiplexer MUX1 24 is disposed between the output of loop filter 4 of frequency synthesiser 10 and IF filter 25. First multiplexer 24 is also connected to the output of mixer 23. A first selection signal Sel1 is supplied by the calibration unit to connect the output of loop filter 4 to IF filter 25 for the method of calibrating the frequency synthesiser, or to connect the output of mixer 23 to IF filter 25 in a normal operating mode of transceiver 1. A second multiplexer MUX2 29 is also provided and controlled by a second selection signal Sel2 from calibration unit 27 to supply an excitation signal Sd from the calibration unit to DAC 7 and to sigma-delta modulator 9 for the calibration method. In normal operating mode, once the synthesiser has been calibrated for example, a data signal data is supplied via second multiplexer 29 to DAC 7 and to sigma-delta modulator 9.

Figure 2:
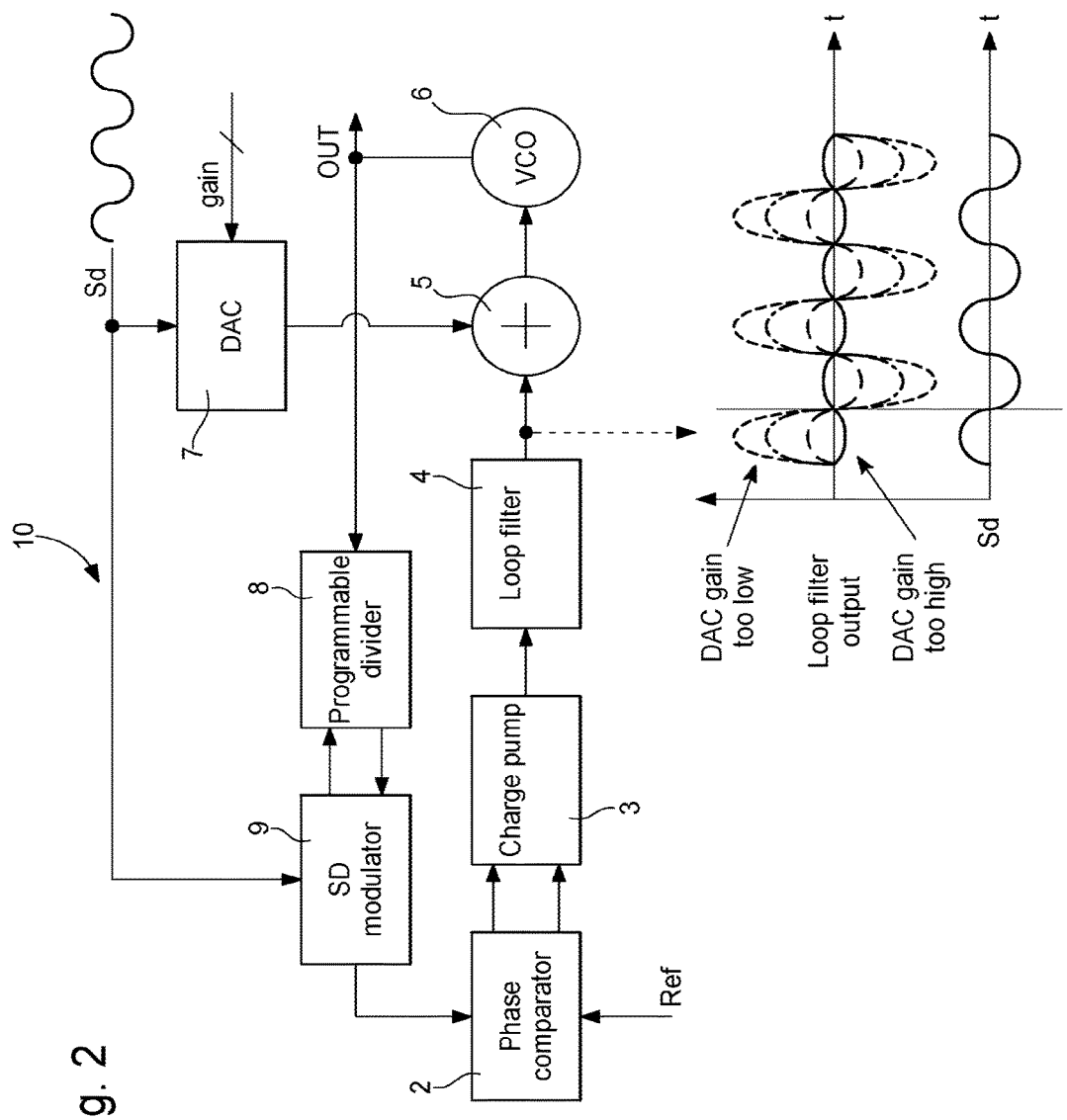
FIG. 2 is a partial view of the synthesiser with the loop filter output signals for adjusting the DAC gain in a second phase of the calibration method according to the invention.

The method for calibrating frequency synthesiser 10 will now be described with reference to FIGS. 1 and 2. The calibration method mainly consists of two calibration phases P1 and P2. Calibration unit 27 transmits the first and second selection signals Sel1 and Sel2 to the two multiplexers 24 and 29 to connect the output of loop filter 4 to IF filter 25 and to connect calibration unit 27 to DAC converter 7 and to sigma-delta modulator 9. The calibration unit supplies an excitation signal Sd to calibrate the frequency synthesiser and primarily DAC 7. Excitation signal Sd may be at a low frequency, for example on the order of 200 Hz, but below the cut-off frequency of loop filter 4, which is generally around 100 kHz.

It is to be noted that loop filter 4 could also be directly connected to the input of calibration unit 27, which digitally converts the loop filter output signal to perform first phase P1. In such case, first multiplexer 24 would no longer be necessary to change into calibration mode.

In a first calibration phase P1, the phase shift is adjusted between excitation signal Sd generated by the calibration unit and mainly transmitted to sigma-delta modulator 9, and the output signal from loop filter 4 received passing through IF filter 25 and VGA amplifier 26 in calibration unit 27. The calibration unit supplies a zero gain to DAC 7 to deactivate it in this first phase.

To adjust the phase shift in phase P1, a core unit 28 is integrated in calibration unit 27 to make a projection onto either the in-phase or quadrature axes of the constellation. This projection may also be made on the basis of the samples in the processing unit. This projection corresponds to one frequency bin, i.e. a single frequency with a half DFT. The output signal from VGA amplifier 26 is thus sampled at the calibration unit input. This core unit 28 can also perform low-pass digital filtering of the incoming signals via a core by means of a temporal sampling window of defined duration. This also efficiently filters the noise generated by the sigma-delta modulator of synthesiser 10 or any other stray noise.

The phase shifted signal in this first phase P1 is brought back either onto the in-phase or quadrature axes of the constellation, preferably onto the I-axis (cosine). There is therefore a projection onto the I-axis in first phase P1, which corresponds to a half DFT. The zero crossings of the signal entering said calibration unit 27 are thus checked by means of a subroutine of the calibration unit for comparison to excitation signal Sd. A variable delay or phase shift offset is thus corrected at the end of phase P1.

It is to be noted that, since IF filter 25 and VGA amplifier 26 of transceiver 1 are used to calibrate frequency synthesiser 10, these two elements generate a greater delay or phase shift than the other elements of the phase-locked loop. Phase shift adjustment must therefore be digitally effected in calibration unit 27 in first phase P1.

It is also to be noted that, when this projection is made of the digitized signal in calibration unit 27, a gain is also observed in the signal noise ratio (SNR) of the observed excitation signal. This also makes fine calibration possible, since the noise present in the Q part is permanently removed the end of this first phase. As a result of this first phase P1, phase alignment is achieved with optimal SNR. Further, since DAC 7 is not operating in first phase P1, there is thus maximum disturbance on the output of loop filter 4. First phase P1 is thus also used to optimise the rejection utilised in second phase P2 as explained below.

Since the excitation signal is known, particularly generated in calibration unit 27, it is possible to modulate this signal, for example, by a pseudo-random signal, and project it onto an equivalent modulated vector (correlation). This also increases rejection relative to noise generated by sigma-delta modulator 9.

In a second calibration phase P2, the gain of DAC 7 is easily adjusted by checking the sign or the polarity of the signal leaving loop filter 4. It is no longer necessary, in this case, to minimise power to calibrate DAC 7. A positive sign or positive polarity indicates that the check in calibration unit 27 defines the output signal of loop filter 4 as in-phase with excitation signal Sd. A negative sign or negative polarity indicates that the check in calibration unit 27 defines the output signal of loop filter 4 as phase-shifted by 180° with respect to excitation signal Sd.

An adjustment by dichotomy algorithm can then be implemented in calibration unit 27. This means that the DAC gain can be simply adjusted, by checking the polarity of the output signal of loop filter 4. As illustrated by the graphs of FIG. 2, if the polarity is defined as negative, this means that the gain of DAC 7 is too high, whereas if the polarity is positive, this means that the gain of DAC 7 is too low. Once the final digital value of the gain of DAC 7 is supplied by the calibration unit, the calibration method ends. The digital gain value may be defined in 7 bits. With this method of calibrating the frequency synthesiser in two phases P1 and P2, it is possible to adjust the gain of DAC 7 in second phase P2 between 0.4 to 5 ms.

At the end of the calibration method, it is easy to change simply into normal operation mode by modifying selection signals Sel1, Sel2 for multiplexers 24, 29. Bluetooth communication can be achieved using the calibrated frequency synthesiser.

Of course, since the synthesiser is calibrated using many of the existing transceiver components, there is no great loss of space required in the integrated circuit. Further, the calibration method can be started at any time in the transceiver in order to calibrate said synthesiser during operation and with calibration performed in closed loop mode. This calibration may occur continuously even during modulation of data to be transmitted. This frequency synthesiser may, for example, be made in 0.18 μm CMOS technology.

From the description that has just been given, several variants of the method for calibrating a frequency synthesiser using two-point modulation in a transceiver can be devised by those skilled in the art without departing from the scope of the invention defined by the claims. It could have been devised to calibrate a synthesiser using PSK or BPSK or QPSK modulation using the same calibration method. It is possible to envisage changing from reception or transmission mode of modulated data signals to calibration mode at any time during operation of the transceiver or at programmed time periods.

What is claimed is:

1. A method for calibrating a frequency synthesiser using two-point modulation in a transceiver, the frequency synthesiser comprising:
    a low-frequency or low-pass phase-locked loop, which comprises at least one phase comparator to compare a reference signal from a reference oscillator, and a modulation signal from a sigma-delta modulator, a charge pump connected to the output of the comparator, a loop filter connected to the output of the charge pump, a voltage-controlled oscillator VCO receiving an output signal from the loop filter, and generating a high frequency signal, and a programmable divider connected to the sigma-delta modulator and receiving the high frequency signal, and
    a high frequency access with a digital-to-analogue converter DAC, which is connected to the voltage-controlled oscillator VCO of the phase-locked loop directly or via an adder, which performs the addition of the output signal from the loop filter, and the output signal from the digital-to-analogue converter,
    wherein the calibration method includes:
    in a first phase of a calibration mode with the phase-locked loop closed, supplying an excitation signal generated by a calibration unit of the transceiver to the sigma-delta modulator by deactivating the digital-to-analogue converter and transmitting the output signal from the loop filter to the calibration unit, which digitally converts the incoming signal transmitted from the output of the loop filter, and offsetting the phase shift between the excitation signal and at least the output signal from the loop filter in the calibration unit, and
    in a second phase of the calibration mode with the phase-locked loop closed, supplying the excitation signal to the sigma-delta modulator and to the activated digital-to-analogue converter, and calibrating the gain of the digital-to-analogue converter, by checking in the calibration unit, the sign or the polarity of the output signal from the loop filter with respect to the excitation signal, and using a dichotomy algorithm to adjust the gain.

2. The calibration method according to claim 1, wherein adjustment of the phase shift of the signal from the loop filter in the first phase is brought back in the calibration unit onto either the in-phase or quadrature axes of the constellation, preferably onto the I-axis (cosine).

3. The calibration method according to claim 2, wherein a projection is made in a core of the calibration unit based on the digitized signal received in particular from the loop filter in order to return the digitized signal from the loop filter onto the I-axis in the first phase.

4. The calibration method according to claim 2, wherein making a projection onto the cosine axis to adjust the phase shift in the core of the calibration unit, it is filtered the noise generated by the sigma-delta modulator of the synthesiser while increasing the signal noise ratio of the observed excitation signal.

5. The calibration method according to claim 1, wherein the calibration unit includes a subroutine to determine zero crossings of the digitized signal from the loop filter to offset the phase shift of the loop filter signal with respect to the excitation signal.

6. The calibration method according to claim 1, wherein in the calibration mode, the output signal from the loop filter passes through an IF filter of the transceiver followed by a VGA amplifier of the transceiver, to transmit to the calibration unit, the IF filter and the VGA amplifier being used in normal operation in a data reception mode of the transceiver,
    wherein in the first phase, an output signal from the VGA amplifier based on the signal from the loop filter is digitally converted in the calibration unit to offset the phase shift with respect to the excitation signal.

7. The calibration method according to claim 6, wherein the transceiver includes a first multiplexer disposed between a mixer to convert the frequency of incoming RF signals and the IF filter, the first multiplexer receiving at input the signal from the loop filter and at least one converted signal from the mixer while being controlled by a first selection signal from the calibration unit, and a second multiplexer disposed between the calibration unit and the frequency synthesiser, the second multiplexer receiving at input the excitation signal from the calibration unit and a data modulation signal while being controlled by a second selection signal from the calibration unit,
    wherein, in calibration mode, the first and second multiplexers are controlled by the first and second selection signals to connect the loop filter to the IF filter via the first multiplexer, and to supply the excitation signal to the frequency synthesiser via the second multiplexer, and once the gain of the digital-to-analogue converter is calibrated in the second phase, a normal operating mode is selected by connecting the output of the mixer to the IF filter via the first multiplexer, and transmitting the data modulation signal to the frequency synthesiser via the second multiplexer.

8. An RF signal transceiver, which includes a frequency synthesiser using two-point modulation suitable to implement the calibration method according to claim 1, the transceiver comprising at least one calibration unit to adjust the phase shift of an excitation signal transmitted to the frequency synthesiser in calibration mode and calibrating the gain of a digital-to-analogue converter by dichotomy algorithm, and wherein the frequency synthesiser includes:
   a low-frequency or low-pass phase-locked loop, which comprises at least one phase comparator to compare a reference signal from a reference oscillator, and a modulation signal from a sigma-delta modulator, a charge pump connected to the output of the comparator, a loop filter connected to the output of the charge pump, a voltage-controlled oscillator VCO receiving an output signal from the loop filter, and generating a high frequency signal, and a programmable divider connected to the sigma-delta modulator and receiving the high frequency signal, and
   a high frequency access with the digital-to-analogue converter DAC, which is connected to the voltage-controlled oscillator VCO of the phase-locked loop directly or via an adder, which performs the addition of the output signal from the loop filter, and the output signal from the digital-to-analogue converter,
   wherein the transceiver includes an IF filter to receive an output signal from the loop filter, followed by a VGA amplifier, to transmit the output signal from the loop filter to the calibration unit, the IF filter and the VGA amplifier being used in normal operation in a data reception mode of the transceiver.

9. The transceiver according to claim 8, wherein the transceiver includes a first multiplexer disposed between a mixer to convert the frequency of incoming RF signals received by an antenna and amplified by a low noise amplifier, and the IF filter, the first multiplexer receiving at input the signal from the loop filter and at least one converted signal from the mixer while being controlled by a first selection signal from the calibration unit, and a second multiplexer disposed between the calibration unit and the frequency synthesiser, the second multiplexer receiving at input the excitation signal from the calibration unit and a data modulation signal while being controlled by a second selection signal from the calibration unit, and the transceiver is configurable in a data reception and transmission mode via the first and second multiplexers controlled by the first and second selection signals or in a calibration mode by connecting the frequency synthesiser to the calibration unit.

10. The transceiver according to claim 8, wherein the transceiver is configurable to change continuously from a reception mode, or a transmission mode, to a calibration mode.

* * * * *